United States Patent [19]

Vetanen et al.

[11] Patent Number: 4,759,822

[45] Date of Patent: Jul. 26, 1988

[54] METHODS FOR PRODUCING AN APERTURE IN A SURFACE

[75] Inventors: William A. Vetanen, Hillsboro; Susette R. Lane, Portland, both of Oreg.

[73] Assignee: TriQuint Semiconductor Inc., Beaverton, Oreg.

[21] Appl. No.: 660,172

[22] Filed: Oct. 12, 1984

[51] Int. Cl.[4] .................... H01L 21/28; H01L 21/288
[52] U.S. Cl. ........................ 156/644; 148/DIG. 105; 148/DIG. 111; 156/656; 437/184; 437/912
[58] Field of Search ............... 156/644, 648, 653, 657, 156/659.1, 656, 661.1, 662, 664, 643; 204/15, 24, 32.1, 34.5, 49, 26; 29/579, 571, 580; 148/1.5, DIG. 26, DIG. 50, DIG. 51, DIG. 53, DIG. 56, DIG. 26, DIG. 111, DIG. 143, DIG. 105, DIG. 106; 427/88, 89; 357/15, 22 I

[56] References Cited

U.S. PATENT DOCUMENTS

| 4,077,111 | 3/1978 | Driver et al. | 29/579 X |
|---|---|---|---|
| 4,104,111 | 8/1978 | Mack | 156/656 |
| 4,127,709 | 11/1978 | Ruben | 204/32.1 X |
| 4,145,459 | 3/1979 | Goel | 156/662 X |
| 4,256,514 | 3/1981 | Pogge | 29/580 X |
| 4,330,343 | 5/1982 | Christou et al. | 148/187 X |
| 4,389,768 | 6/1983 | Fowler et al. | 29/571 |
| 4,495,025 | 1/1985 | Haskell | 156/653 X |
| 4,496,419 | 1/1985 | Nulman et al. | 156/643 |
| 4,525,919 | 7/1985 | Fabian | 29/579 X |
| 4,536,942 | 8/1985 | Chao et al. | 29/571 |
| 4,542,577 | 9/1985 | Jackson | 29/571 |

OTHER PUBLICATIONS

Jackson, T. N. et al., "A Novel Submicron Fabrication Technique", IEEE IEDM Sect. 3.6, Sep. 1979, pp. 58-61.

Primary Examiner—Robert A. Dawson
Assistant Examiner—Ramon Hoch
Attorney, Agent, or Firm—William S. Lovell; John Smith-Hill; John D. Winkelman

[57] ABSTRACT

A method of electrolytic deposition of metal is used to decrease the minimum size pattern that can be obtained using photolithography. In the manufacture of integrated circuits, a layer of metal and then photoresist is deposited on the dielectric layer of the substrate prior to masking to define the gate apertures. After masking and etching through to the dielectric, metal is electrodeposited on the metal edges that abut the gate aperture, thus decreasing the aperture size. After that decreased gate dimension is etched into the dielectric to define the gate lengths of the semiconductor devices, the wafer is stripped and the subsequent manufacture proceeds in the conventional manner.

8 Claims, 2 Drawing Sheets

METHODS FOR PRODUCING AN APERTURE IN A SURFACE

FIELD OF THE INVENTION

The subject matter of the present invention relates to methods for producing an aperture in a surface, and particularly, but not exclusively, to methods for obtaining apertures of sublithographic dimension in the manufacture of integrated circuits, and especially submicron apertures for defining the gate lengths of transistors for high speed operation.

STATEMENT OF PRIOR ART

A critical element in the development of fast operating transistors and integrated circuits is the minimum gate length that these devices may be given. Determination of that gate length will often rest upon the minimum dimension that may be etched through a dielectric layer to an underlying substrate.

To obtain a minimum dimension by conventional photolithography, a photoresist layer is placed over the dielectric layer and is then masked in the desired pattern. After exposure to radiation, either the exposed or the unexposed portions of that resist are removed. Through the apertures so created, portions of the underlying dielectric layer corresponding to the pattern of the original photolithographic mask are removed by etching. The minimum linear dimension that can be created in that fashion using optical radiation is on the order of one micrometer ($\mu$m). Half micrometer lithography is occasionally achieved, but with reduced yield and uniformity.

Such a limitation arises not from the photolithographic masking itself or from the etching process, but rather from diffraction of the light impinging upon the mask. Spreading of the irradiating light beam distorts the image created in the photoresist layer and ultimately in the underlying dielectric layer.

In the current art, one solution to this problem has been found in the use of radiation of shorter wavelengths, such as x-rays or electron beams. However, those processes require the use of expensive special equipment that adds to the manufacturing costs. It would then be advantageous if one could continue to use optical lithography.

Another alternative is found in an "edge etch" process as set forth in IEEE Trans. on Electron Devices, vol. ED - 25, No. 1, Jan. 1978, pp. 67-69. A thin passivation layer is deposited through the openings in a much thicker mask layer, and controlled etching at the juncture between the two layers then exposes the underlying dielectric. Problems of process control and low yield have prevented this technique from becoming commercially viable.

In a "plasma etching" process set forth in Tech. Digest of the 1976 IDEM, Sect. 9.6, Dec, 1976, pp. 214-217, the gate is formed directly on the semiconductor surface. A two-metal double layer is established on the substrate using conventional photolithography, and then the underlying metal in contact with the substrate is selectively etched away. This procedure has also not reached commercial application.

An "edge-plating" process described in IEEE IEDM Sect. 3.6, Sept. 1979, pp. 58-61, also uses a two-metal double layer to place the gate directly on the substrate, but in this case portions of the upper metal are first removed. The edges of the upper metal so exposed are then plated with a third metal which serves as a mask in removing a portion of the original double layers. The lower metal protected by such mask then remains to serve as the gate.

The special steps employed in this edge-plating process include the use of special mask sets in a separate gate metallization step. In addition, directional evaporation of the gate metal is employed, so that rotation of the substrate is prohibited. Formation of the wider interconnect lines and the gate recess process must also be performed separately from the gate metallization. It is also difficult to control the gate dimension when etching away the original metal.

U.S. Pat. No. 4,389,768 to Fowler et al discloses a structure comprising a lightly doped layer in source, drain and channel regions, above that more heavily doped mesas in source and drain regions only, and above that a dielectric covering. The channel space between the mesas may be defined at the photolithographic limit. Directional reactive ion etching then removes some of the dielectric over this channel space, thereby defining a gate region of a smaller dimension and leaving dielectric sidewalls on the mesas. Source and drain regions are formed by thermal diffusion from the mesas into the lower region, including some lateral diffusion into the channel under the sidewalls. However, the channel length will generally be greater than the gate length, since the lateral diffusion cannot be precisely controlled.

In U.S. Pat. No. 4,449,287 to Maas et al, submicron apertures are formed in a dielectric substrate by a complex series of depositions, thermal oxidations, and etching of selected dielectric layers.

SUMMARY OF THE INVENTION

The invention may be used to permit fabrication of submicron apertures in a substrate for purposes of manufacturing high speed transistors and integrated circuits and for other application. The invention may further be used to exceed the lithographic limits in the minimum dimension of such apertures, but in a way that will not require expensive special equipment or process steps, so that departures from conventional manufacturing processes will be minimized.

In a preferred embodiment of the invention, a dielectric layer overlying a substrate is first formed. A metal film is deposited onto the dielectric layer followed by a photoresist layer which is masked, exposed and developed to generate appropriate photoresist images. The metal film is then etched to expose the underlying dielectric in a pattern established by the image. The portions of metal film abutting the gap so created are then subjected to controlled electrodeposition of additional metal, thus decreasing the area of the exposed dielectric. Etching of the underlying dielectric then defines an aperture or gate length that is likewise smaller than the lithographic limit. The remaining steps of manufacture may be entirely conventional, or special gate metallization techniques may be employed, but in either case a self-aligned gate structure of sublithographic dimension will be achieved.

BRIEF DESCRIPTION OF THE DRAWINGS

FIG. 1 shows an initial structure that is appropriate for such purpose, and then the succeeding figures lead to the final product shown in FIG. 5.

DETAILED DESCRIPTION

A method embodying the invention is employed in processes for creating apertures in a surface, or in added layers overlying such a surface, and particularly as an adjunct to conventional photolithography. In the context of integrated circuit manufacture, such a surface may be the surface of a structure such as that shown in FIG. 1 where there appear transistor elements such as source and drain regions, and the invention then serves to create gate elements that are shorter than conventional photolithography permits.

Figure 1:
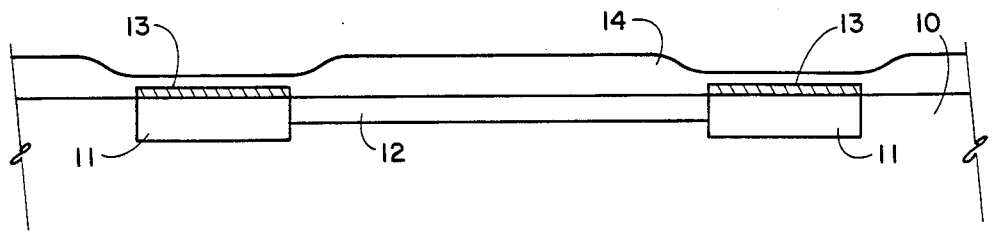
FIGS. 1-5 illustrate the successive steps of carrying out the process of the present invention in the particular case of a GaAs transistor device.

FIG. 1 illustrates a substrate 10 formed from an undoped GaAs wafer grown by the liquid encapsulated Czochraliski (LEC) method. This method has been described in M. Nowogradski, Ed., Advanced III-V Semiconductor Materials Technology Assessment, Noyes Publications, Park Ridge. N.J., 1984, pp. 25–33. A 100 nm $SiO_2$ layer (not shown) is formed on a cleaned major surface of substrate 10 by chemical vapor deposition (CVD). Masked photoresist layers (also not shown) are used to define areas for regions 11 which will constitute the n+ source and drain elements, and an area for the n− channel region 12 which interconnects regions 11. Silicon is then ion-implanted into the substrate 10 throughout regions 11 and 12 to a concentration of about $2-3 \times 10^{17}$ cm$^{-3}$. A second masking is then used to allow ion-implantation of silicon into the n+ regions 11 only, to a concentration of approximately $3 \times 10^{18}$ cm$^{-3}$. For ion activation, a second 100 nm layer of $SiO_2$ (not shown) is formed by CVD to serve as an anneal cap. Annealing is then carried out at about 800° C. In order to carry out the remaining steps, all of the $SiO_2$ is then removed.

A 100 nm layer of silicon nitride ($Si_3 N_4$) is then applied by sputtering, and photolithographic masking and etching are again used to give access to regions 11 only. Above regions 11, a Au-Ge-Ni alloy is deposited by electron beam evaporation to form ohmic contacts 13. After removing the photoresist material, an additional 100 nm of $Si_3 N_4$ is applied to the entire surface to form the dielectric layer 14 and complete the structure of FIG. 1.

Figure 2:
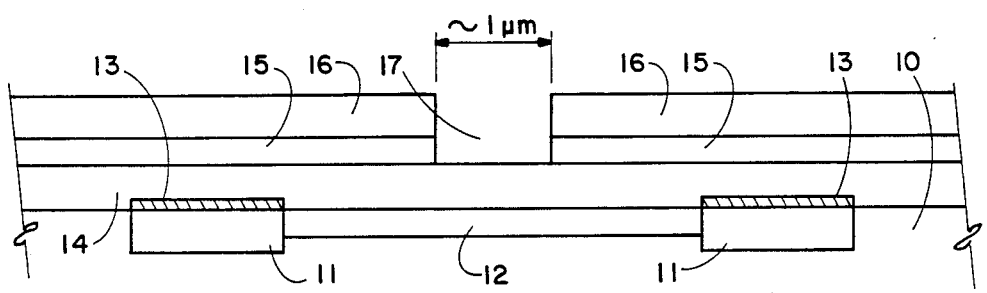

In FIG. 2, the electron beam evaporation is employed to deposit metal film 15 over the entire surface of dielectric layer 14. To form a metal film 15 in this preferred embodiment, there is first deposited 5 nm of Ti, then 50 nm of Au, and then another 10 nm of Ti. A photoresist layer 16 is then deposited over all of metal film 15 and masked to define an area for gate aperture 17. Plasma and/or wet chemical etching of metal film 15 down to the dielectric layer 14 then form gate aperture 17. Using optical lithography, gate aperture 17 can be given a minimum dimension of about 1 micrometer. The etching which produces aperture 17 then completes the structure of FIG. 2.

Electrolytic deposition is then employed to deposit nickel on the edges of the film 15 that are exposed at the boundary of the aperture 17. This is accomplished by placing the structure of FIG. 2 and a sheet of Ni in an electrolytic solution containing nickel ions, with the metal film 15 and the sheet of Ni connected to a d.c. voltage source as cathode and anode respectively. Connection is made to the metal film 15 at the periphery of the wafer. A secondary cathode, comprising a sheet of Ni having a surface area many times the exposed area of the metal film 15, is also connected to the voltage source and is immersed in the electrolytic solution, thus avoiding any extremes in current density which could occur if the exposed areas of the metal film 15 were the only cathode surface.

It is preferred that the electrolytic solution should comprise an acidic, aqueous solution of nickel sulfate prepared from commercially available electrolyte formulations (Watts-type nickel bath), with the concentration of nickel sulfate in the range from 250-330 g/l. Proper deposition will then occur using a current of 100 mA at 6 v for approximately 45 seconds. In order to obtain a deposit of uniform thickness, deposition takes place at a temperature of 44° C.

Figure 3:
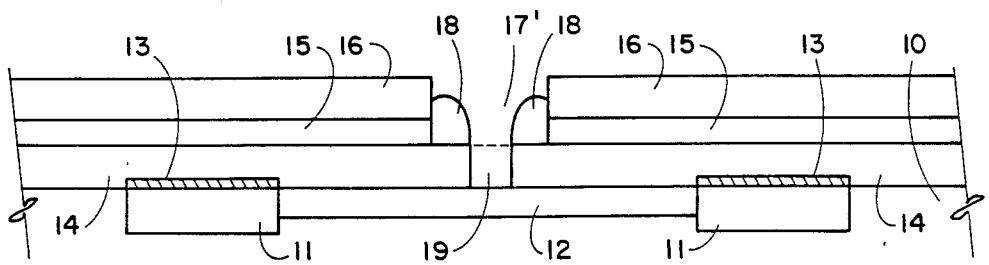

FIG. 3 shows the regions of electrodeposited nickel 18 that result from the electrodeposition process and bound an aperture region 17′ which is reduced in size compared to the aperture 17.

The metal regions 18 so formed then provide additional masking and reduce the area of the layer 14 that is exposed. A plasma enhanced chemical etch of the underlying dielectric 14 then yields gate region 19. The photoresist layer 16, metal film 15, and the metal regions 18 are then removed by selective solvents and chemical etches in a conventional manner.

Figure 4:
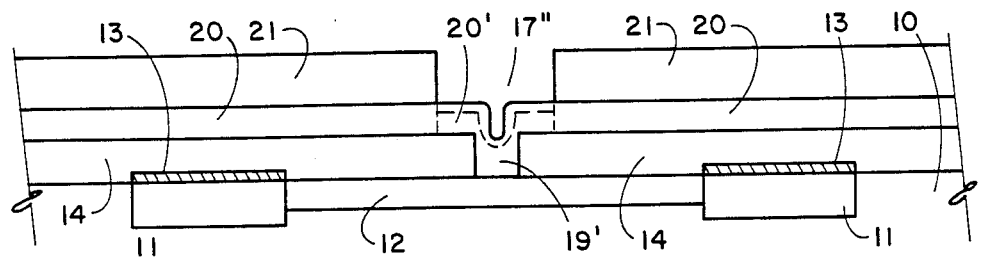

FIG. 4 then illustrates the gate metallization procedure employed in this preferred embodiment. On a clean surface consisting of dielectric layer 14 and the surface of layer 12 exposed through gate region 19 a metal layer 20 is formed by sputtering first 70 nm of TiW, then 40 nm of Pd, and finally another 20 nm of TiW. In that process, gate region 19 becomes filled with metal to become the actual gate element 19′. Photoresist layer 21 is then applied and is masked using the same mask as was employed in creating gate aperture 17. Layer 21 is exposed and the photoresist is removed to define an aperture 17″ of the same size, shape and position as the gate aperture 17. The top 20 nm of TiW is etched out through the aperture 17″ to expose a clean surface of Pd. The remaining metal of the layer 20 that is exposed through the aperture 17″ makes up a premetallization layer 20′ shown below the dashed line in FIG. 4.

Figure 5:
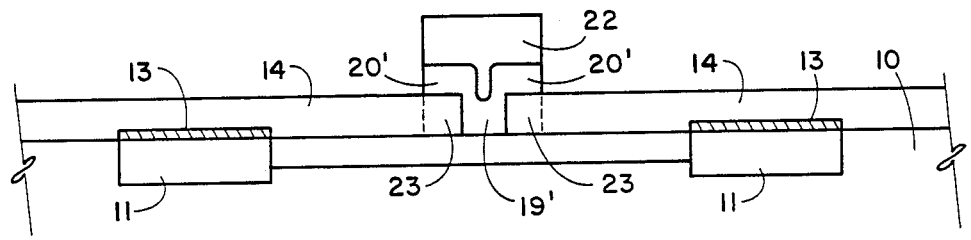

Onto the clean Pd surface of the premetallization layer 20′, and within the aperture 17″, Au is then plated up to about 600 nm to constitute the gate metal 22. Photoresist layer 21 is then removed, and gate metal 22 serves to mask the gate element 19′ and its adjacent protected regions 23 as the layer 20 is etched back to the dielectric layer 14. The completed structure is then shown in FIG. 5.

By use of the described method, gate lengths measured in the range from 0.5 to 0.3 μm has been obtained. This compares favorably to the minimum gate length of 1 μm that is normally obtainable using conventional photolithography.

With respect to the scope of the present invention, it should be understood that the foregoing description should by no means be construed as a limitation thereof. In particular, the description of the fabrication of a simple GaAs MESFET is provided as a matter of convenience only, it being clear that the process herein described of using an electrodeposited metal as an additional mask to yield an etch region smaller than the photolithographic limit may be incorporated into a variety of fabrication processes. In the embodiment described, for example, upon removal of Photoresist layer 21 is then applied and is masked using the same mask as was employed in creating gate aperture 17. Layer 21 is exposed and the photoresist is removed to define an aperture 17" of the same size, shape and position as the gate aperture 17. The top 20 nm of TiW is etched out through the aperture 17" to expose a clean surface of Pd. The remaining metal of the layer 20 that is exposed through the aperture 17" makes up a premetallization layer 20' shown below the dashed line in FIG. 4.

Onto the clean Pd surface of the premetallization layer 20', and within the aperture 17", Au is then plated up to about 600 nm to constitute the gate metal 22. Photoresist layer 21 is then removed, and gate metal 22 serves to mask the gate element 19' and its adjacent protected regions 23 as the layer 20 is etched back to the dielectric layer 14. The completed structure is then shown in FIG. 5.

By use of the described method, gate lengths measured in the range from 0.5 to 0.3 $\mu$m have been obtained. This compares favorably to the minimum gate length of 1 $\mu$m that is normally obtainable using conventional photolithography.

With respect to the scope of the present invention, it should be understood that the foregoing description should by no means be construed as a limitation thereof. In particular, the description of the fabrication of a simple GaAs MESFET is provided as a matter of convenience only, it being clear that the process herein described of using an electrodeposited metal as an additional mask to yield an etch region smaller than the photolithographic limit may be incorporated into a variety of fabrication processes. In the embodiment described, for example, upon removal of photoresist layer 16, metal film 15 and the metal regions 18 as shown in FIG. 3, one may then perform etching of the GaAs substrate to produce the commonly employed gate recess structure before proceeding to the gate metallization procedure described thereafter. One should also note that, in contrast to most of the procedures for obtaining minimum gate lengths as earlier described, but consistent with the procedures of the present invention, a gate recess so obtained would be self-aligned to the gate metal and would have dimensions commensurate with the reduced gate length. That is significant from the point of view of seeking increased device performance.

In the detailed description itself, the single device described is of course intended to represent a plurality of such devides on a single wafer or group of wafers. With respect to the process details, the use of a three-state metal film 15 is helpful for the electrodeposition which will follow, but it should be understood that the metals actually employed are only required to be electrically conducting and susceptible to an even electrodeposition thereon, and their precise dimensions may also be varied. For example, metal films of sputtered TiW and evaporated copper have also been employed. One may also employ alternative gate metallization procedures, and one may define the gate aperture region 17 as shown in FIG. 2 either photolithographically as herein described or by the use of electron beam of x-ray lithography. Similarly, with respect to the electrodeposition process, it is obvious that various metal salts at various concentrations may be employed for the same purpose, and one may also use a variety of voltage, current and timing conditions to achieve the desired electrodeposition, so long as a minimum plating voltage is employed, without departing from the scope of the invention. An advantage of this electrodeposition process which should be noted is that it tends to be self-limiting, in that the shorter the gate length is made, the less metal will be plated.

It will then be understood that none of such changes or modifications, or any other changes or modifications as would be apparent to a person of ordinary skill in the art, will result in a departure from the scope of the present invention as defined in the appended claims, and equivalents thereof, and that all of the same shall be incorporated within such scope. The essentials of this invention are found in the process as claimed for using the deposition of a metal to reduce an aperture size, however such aperture may be formed and however such metal may be deposited. In particular, the invention then finds use an adjunct to the several lithographic techniques employed in integrated circuit fabrication. Reference is made in the claims to the first layer (of conductive material) and the second layer (of dielectric material) being substantially coextensive. It will be understood that for the purposes of the invention, the first and second layers need only be substantially coextensive in the vicinity of the aperture that they define, their relative extent away from the aperture being irrelevant to the invention. Moreover, references in the claims to a body or member being of dielectric material are intended to be taken in the context in which they are presented, namely, relative to a metal or other conductive material in an electrodeposition process. It is necessary only that the resistivity of the dielectric material be sufficient that the metal that is electrodeposited be deposited on the conductive material rather than the dielectric material.

We claim:

1. A method of defining the area of an enclosure within a surface of a member of dielectric material, comprising providing on said surface a first layer of conductive material and a second layer of dielectric material, said first layer lying between said surface and said second layer, said first and second layers defining an aperture through which said surface is exposed and being substantially coextensive, and edges of the first layer abutting the aperture being exposed, and said method also comprising electrodepositing metal upon the exposed edges of said first layer so as to reduce the size of said aperture through which said surface is exposed, etching away said exposed surface of said dielectric material to a predetermined depth, and filling the area so etched away with a material that is different from said dielectric material.

2. A method of forming within a surface an enclosure having an area less than that obtainable by lithography by reducing the area of said surface that is exposed through a lithographically-defined aperture in a layer of dielectric material deposited on the surface, said surface being a surface of a member of dielectric material, said method comprising providing, between said layer of dielectric material and said surface of the dielectric member, a layer of conductive material which is substantially coextensive with the layer of dielectric material and has exposed edges bounding the aperture, electrodepositing metal upon the enclosed edges so as to reduce the size of said aperture, etching the surface area that remains through said aperture, and filling the area so etched away with a substance of a different material than that constituting said member of dielectric material.

3. A method for producing an enclosed material within a surface of a dielectric body, comprising the steps of
   a. providing on said surface a structure made up of a metal film overlaid by a mask layer, said structure defining an opening through which said surface is exposed, and the portions of said metal film abutting said opening defining respective metal edges,
   b. electrodepositing metal upon said metal edges so as to reduce the exposed area of said surface,
   c. etching said surface to a predetermined depth into said body, whereby said electrodeposited metal serves as a mask to limit the etching process to the reduced exposed area of said surface,
   d. removing said mask layer, electrodeposited metal and metal film, and
   e. filling said predetermined depth within said body with a substance of a different material than said body.

4. A method according to claim 3, wherein said body is constituted by a layer of dielectric material on a main face of a substrate of semiconductive or semi-insulative material.

5. A method according to claim 4, further comprising, before step (a), forming in said substrate a channel region, a source region and a drain region, said channel region being disposed between the source and drain regions, and wherein said opening is formed over the channel region.

6. A method according to claim 5, wherein said body comprises undoped GaAs, the channel region comprises an n− region and the source and drain regions comprise n+ regions.

7. A method according to claim 6, wherein said dielectric layer is of silicon nitride, said n− and n+ regions are formed by ion-implantation of silicon, and said electrodeposited metal is nickel.

8. A method according to claim 3, wherein step (b) is accomplished by connecting the metal film to a d.c. voltage source as cathode and immersing the body in an electrolytic bath containing ions of the metal to be electrodeposited with an electrode connected to said d.c. voltage source as anode, and wherein a third electrode connected to said d.c. voltage source as an auxiliary cathode is also immersed in said bath.

* * * * *